United States Patent
Akahori et al.

(10) Patent No.: US 7,514,687 B2
(45) Date of Patent: Apr. 7, 2009

(54) ENERGY RAY DETECTING ELEMENT (75) Inventors: Hiroshi Akahori, Hamamatsu (JP); Tatsuki Kasuya, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 10/574,600

(22) PCT Filed: Sep. 30, 2004

(86) PCT No.: PCT/JP2004/014386

§ 371 (c)(1),
(2), (4) Date: Jan. 25, 2007

(87) PCT Pub. No.: WO2005/036648

PCT Pub. Date: Apr. 21, 2005

(65) Prior Publication Data

US 2007/0272869 A1 Nov. 29, 2007

(30) Foreign Application Priority Data

Oct. 7, 2003 (JP) .............................. 2003-348583

(51) Int. Cl.
*G01T 1/24* (2006.01)
(52) U.S. Cl. ................................. 250/370.01
(58) Field of Classification Search ............. 250/336.1, 250/370.01, 370.14
See application file for complete search history.

(56) References Cited

U.S. PATENT DOCUMENTS

| | | | | |
|---|---|---|---|---|
| 4,367,404 A * | 1/1983 | Kaye | ........................... | 250/207 |
| 5,453,610 A * | 9/1995 | Gibbons | ........................ | 250/207 |
| 5,512,755 A * | 4/1996 | Vickers et al. | ......... | 250/363.09 |
| 5,615,242 A | 3/1997 | Hirota | | |
| 5,637,959 A * | 6/1997 | Kyushima et al. | ............. | 313/533 |
| 5,880,457 A * | 3/1999 | Tomiyama et al. | ........... | 250/207 |
| 6,177,665 B1 * | 1/2001 | Wolf | ........................... | 250/207 |
| 6,841,936 B2 * | 1/2005 | Keller et al. | ................. | 313/533 |
| 7,030,355 B1 * | 4/2006 | Bochenski et al. | ........... | 250/207 |

FOREIGN PATENT DOCUMENTS

| | | |
|---|---|---|
| EP | 0732702 A2 | 9/1996 |
| JP | 48-41159 | 5/1973 |
| JP | 53-27382 | 3/1978 |
| JP | 55-165687 | 12/1980 |

(Continued)

*Primary Examiner*—David P. Porta
*Assistant Examiner*—David S Baker
(74) *Attorney, Agent, or Firm*—Drinker Biddle & Reath LLP (57) ABSTRACT

The present invention relates to an energy ray detecting element having a structure for reducing noise effectively. The energy ray detecting element comprises an energy ray sensitive region, an output section, a plurality of electrodes, and a voltage dividing circuit. The energy ray sensitive region generates charges in response to the incidence of energy rays. On the surface of the energy ray sensitive region, each of the plurality of electrodes is arranged so as to cover a part of the energy ray sensitive region. Each electrode is electrically connected to the voltage dividing circuit that includes a plurality of voltage dividing resistors serially connected to each other. The voltage dividing circuit divides a DC output voltage from a DC power supply by using the voltage dividing resistors, and thereby providing a corresponding DC output potential to each of the electrodes. The output section accumulates the charges generated in the energy ray sensitive region and outputs a current signal or a voltage signal corresponding to the accumulated charge amount.

4 Claims, 5 Drawing Sheets

FOREIGN PATENT DOCUMENTS

| | | | |
|---|---|---|---|
| JP | 55165687 A | * | 12/1980 |
| JP | 56-057367 | | 5/1981 |
| JP | 57-105893 | | 7/1982 |
| JP | 60-062280 | | 4/1985 |
| JP | 61-164383 | | 7/1986 |
| JP | 5-75090 | | 3/1993 |
| JP | 05075090 A | * | 3/1993 |
| JP | 5-182490 | | 7/1993 |
| JP | 6-350122 | | 12/1994 |
| JP | 10-178588 | | 6/1998 |
| JP | 11-136558 | | 5/1999 |
| JP | 2000-092398 | | 3/2000 |

* cited by examiner

ENERGY RAY DETECTING ELEMENT

TECHNICAL FIELD

The present invention relates to an energy ray detecting element for detecting energy ray such as ultraviolet rays, infrared rays, visible light, electron beams, radiation, X-rays, or the like.

BACKGROUND ART

As described for example in Patent Document 1, an energy ray detecting element, which comprises an energy ray sensitive region that is formed on a surface of a semiconductor substrate and that generates charges in response to the incidence of energy rays, is known.

In this type of energy ray detecting element, the amount of the charges generated at the energy ray sensitive region must be taken out upon conversion into a current signal or a voltage signal. Therefore, the energy ray sensitive region is electrically connected through an electrode to a circuit for converting the amount of the generated charge to the current signal or voltage signal.

Patent Document 1: Japanese Patent Application Laid-Open No. 6-350122.

DISCLOSURE OF THE INVENTION

Problems to be Solved by the Invention

After studying the conventional energy ray detecting element in detail, the inventors found the following problems. Namely, with the energy ray detecting element with the arrangement described in the above-described Patent Document 1, when the amount of charges generated at the energy ray sensitive region is to be taken out upon conversion to a voltage signal by connecting, for example, a charge-to-voltage converting circuit, kTC noise is generated. This kTC noise takes up a large proportion of the noise generated in the energy ray detecting element as a whole and is proportional to the square root of the capacitance of the charge-to-voltage converting circuit. When the charge-to-voltage converting circuit is directly connected to the energy ray sensitive region, since the total capacitance will be made up of the junction capacitance of the energy ray sensitive region and the wiring capacitance, the noise will be large. Also, since when the area of the energy ray sensitive region increases, the junction capacitance also increases, noise increases with an increase in the area as well.

Also when the area of the energy ray sensitive region increases, it becomes difficult to sweep out all of the generated charges and leaving of unread charges occurs. The charge amount that is read thus decreases and the noise increases relatively.

The present invention has been made to solve the above problems and an object thereof is to provide an energy ray detecting element with a structure for reducing noise effectively.

Means for Solving the Problems

In order to achieve the above object, an energy ray detecting element according to the present invention comprises a semiconductor substrate, an output section, a plurality of electrodes, and a voltage dividing circuit that includes a plurality of serially connected voltage dividing resistors. The semiconductor substrate has an energy ray sensitive region that is formed thereon and generates charges in response to the incidence of energy rays. The output section accumulates the charges generated in the energy ray sensitive region and outputs a current signal or a voltage signal corresponding to the accumulated charge amount. The electrodes are respectively positioned close to each other so as to cover a part of the energy ray sensitive region and transfers the charges generated in the energy ray sensitive region to the output section. The voltage dividing circuit is connected electrically to each of the electrodes, and each of the voltage dividing resistors provides a corresponding DC output potential to the associated one of the electrodes by dividing a DC output voltage from a DC power supply. The electrodes that are positioned closely are separated by an amount such that the potential wells which are formed below the respective electrodes when the predetermined potentials are provided, contact each other.

In the energy ray detecting element according to the present invention, each of the electrodes is provided with a corresponding DC output potential by the voltage dividing circuit. In this process, by the voltage dividing circuit providing the corresponding DC output potential to each of the electrodes so that the potential well that is formed below each electrode gradually deepens along the direction of transferring the charges, a single potential gradient is formed in the energy ray sensitive region. The generated charges thus move rapidly along the potential gradient and towards the output section and the leaving of unread charges is unlikely to occur. Consequently, noise can be prevented from becoming large in a relative manner while the charge amount read does not decrease.

In the energy ray detecting element according to the present invention, the output section preferably includes an impurity region (referred to hereinafter as a "floating diffusion"), which accumulates the charges generated in the energy ray sensitive region, and a gate, which inhibits or allows the movement of charges from the energy ray sensitive region to the floating diffusion based on a signal input.

With this arrangement, when the movement of charges to the floating diffusion is allowed by the gate, the charges generated in the energy ray sensitive region are accumulated in the floating diffusion. On the other hand, when the movement of charges to the floating diffusion is inhibited by the gate, the energy ray sensitive region and the floating diffusion are capacitively decoupled while the charges generated in the energy ray sensitive region do not flow into the floating diffusion. Since the energy ray sensitive region and the floating diffusion are capacitively decoupled, the capacitance of the energy ray sensitive region will not be affected when the amount of charges accumulated in the floating diffusion is converted into the current signal or the voltage signal. Though the capacitance of the floating diffusion will be affected when the amount of charges accumulated in the floating diffusion is converted into the current signal or the voltage signal, the floating diffusion can normally be made small in area as compared with the energy ray sensitive region and can thus be made small in capacitance. Since the energy ray sensitive region and the floating diffusion can thus be capacitively decoupled, the noise that is generated in the process of converting the accumulated charge amount to the current signal or the voltage signal can be made small.

Effects of the Invention

In accordance with the present invention, the noise contained in the detected signal can be reduced effectively as compared with the conventional energy ray detecting element.

DESCRIPTION OF SYMBOLS

1 . . . energy ray detecting element, 11 . . . energy ray sensitive region, 15 . . . electrode, 17 . . . voltage dividing resistor, 19 . . . DC power supply, 21 . . . output section, 23 . . . summing gate, 25 . . . output gate, 27 . . . floating diffusion, 29 . . . charge resetting MOSFET; 31 . . . charge-to-voltage converting MOSFET; 39 . . . resistor; 51 . . . semiconductor substrate; 53 . . . p-type Si substrate; and 55 . . . n-type semiconductor layer.

Best Modes for Carrying Out the Invention

Embodiments of an energy ray detecting element according to the present invention shall now be described in detail with reference to FIGS. 1 to 5. In the description of the drawings, elements that are the same or have the same functions shall be provided with the same symbols and redundant description shall be omitted.

Figure 1:
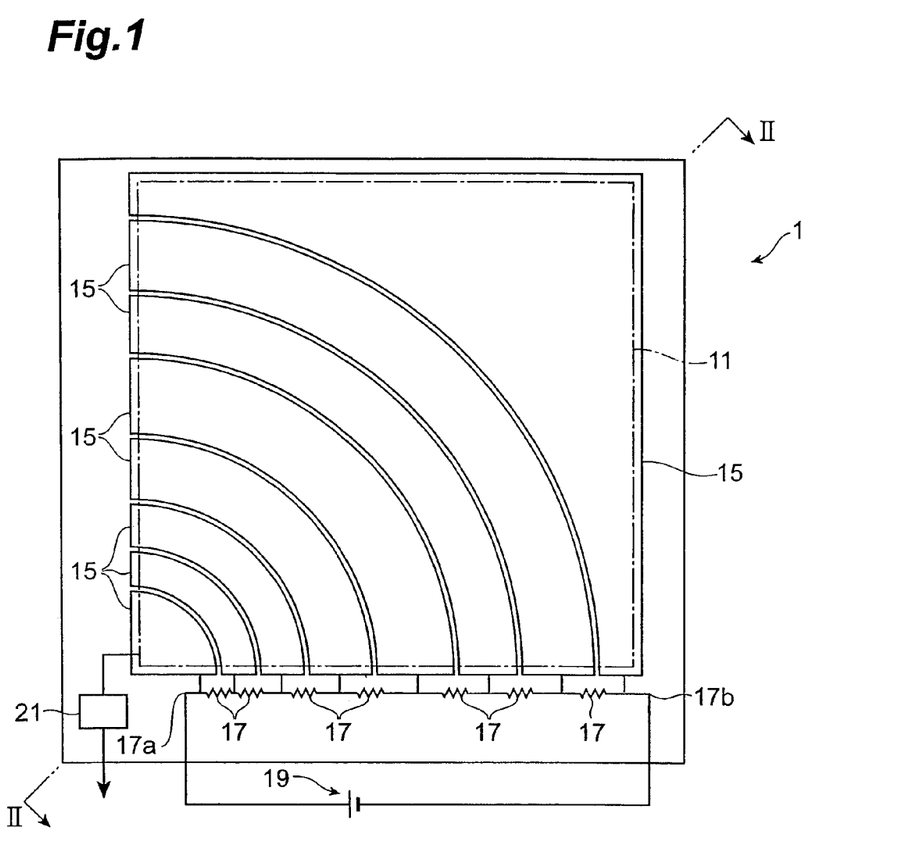
FIG. 1 is a plan view of an arrangement of a first embodiment of an energy ray detecting element according to the present invention.

FIG. 1 is a plan view of an arrangement of a first embodiment of an energy ray detecting element according to the present invention.

Figure 2:
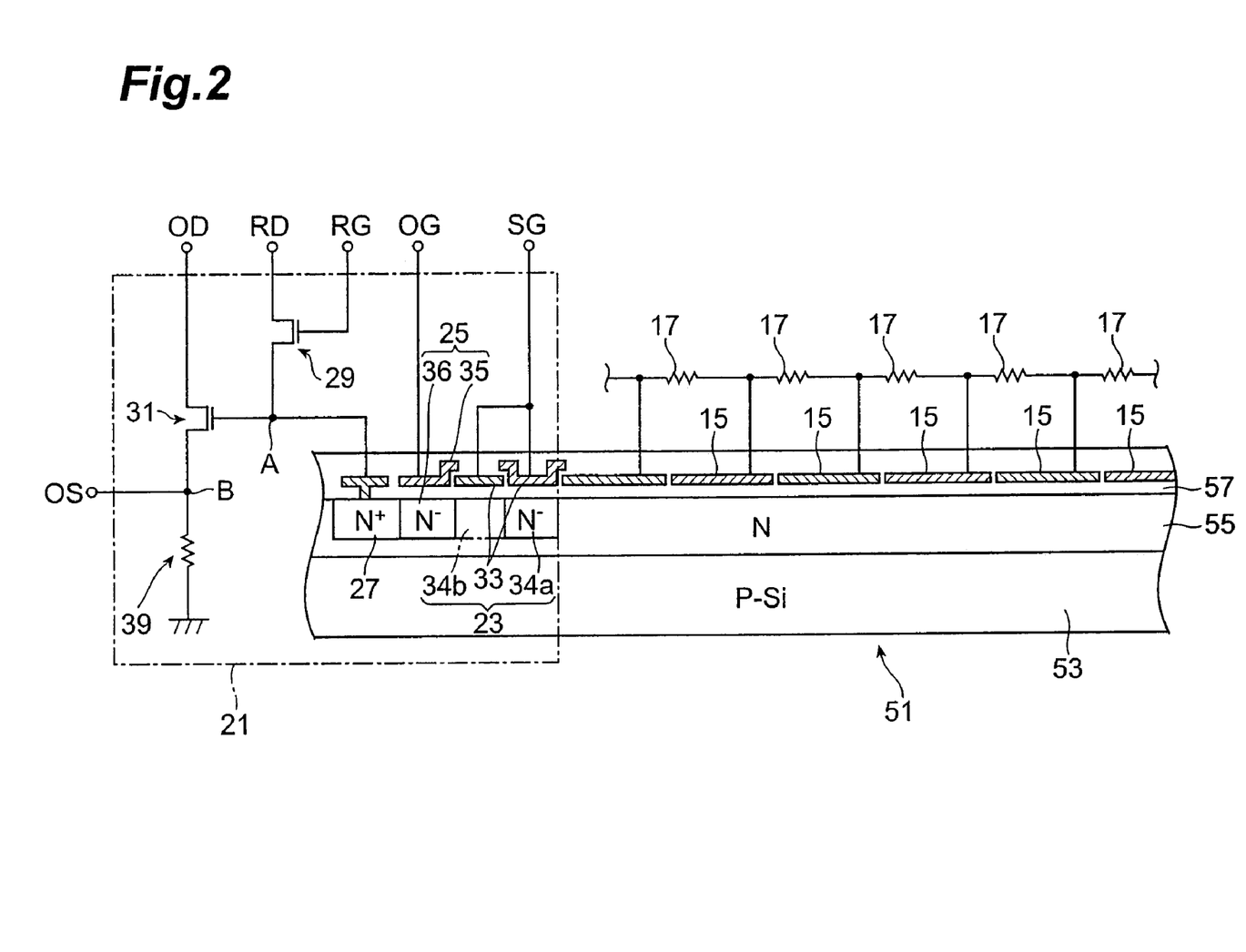
FIG. 2 is a sectional view taken along the line II-II of the energy ray detecting element according to the first embodiment shown in FIG. 1.

FIG. 2 is a sectional view taken along the line II-II of the energy ray detecting element of FIG. 1.

As shown in FIG. 1, an energy ray detecting element 1 according to the first embodiment has an energy ray sensitive region 11 and an output section 21.

The energy ray sensitive region 11 generates charges in response to the incidence of ultraviolet rays, infrared rays, visible light, electron beams, or other energy rays. Energy ray sensitive region 11 has a rectangular shape (of a size of 500 μm×500 μm in the first embodiment) as viewed in the direction of incidence of the energy rays.

On a top surface of the energy ray sensitive region 11, a plurality of electrodes 15 are arranged so that each covers a part of the energy ray sensitive region 11. Each of the plurality of the electrodes 15 has edges of a substantially quarter-circular shape.

Each electrode 15 is electrically connected to a voltage dividing circuit that has a plurality of voltage dividing resistors 17 that are serially connected to each other. Each voltage dividing resistor 17 is provided in correspondence to each electrode 15 and divides a DC output voltage from a DC power supply 19. By this arrangement, a DC output potential that is in correspondence to the position of connection to the voltage dividing resistor 17 is provided to each electrode 15.

As shown in FIG. 2, the energy ray sensitive region 11, electrodes 15, and voltage dividing resistors 17 are formed on a semiconductor substrate 51. The semiconductor substrate 51 has a rectangular shape (of 1000 μm×1000 μm in the first embodiment) as viewed in the direction of incidence of the energy rays. The semiconductor substrate 51 has a p-type Si substrate 53 that is of the p conductive type and serves as a base of the semiconductor substrate 51, and an n-type semiconductor layer 55 that is formed on the top surface of the p-type Si substrate 53. The p-type Si substrate 53 and n-type semiconductor layer 55 form a pn junction, and the n-type semiconductor layer 55 is the energy ray sensitive region that generates charges upon incidence of the energy rays. The electrodes 15 are arranged across an insulating layer 57 on the top surface of the semiconductor substrate 51. Each electrode 15 is arranged so as to cover a part of the energy ray sensitive region 11. The electrodes 15 and insulating layer 57 are comprised of materials that transmit the energy rays, and in the first embodiment, the electrodes 15 are formed of a polysilicon film and the insulating layer 57 is comprised of a silicon oxide film.

Figure 3:
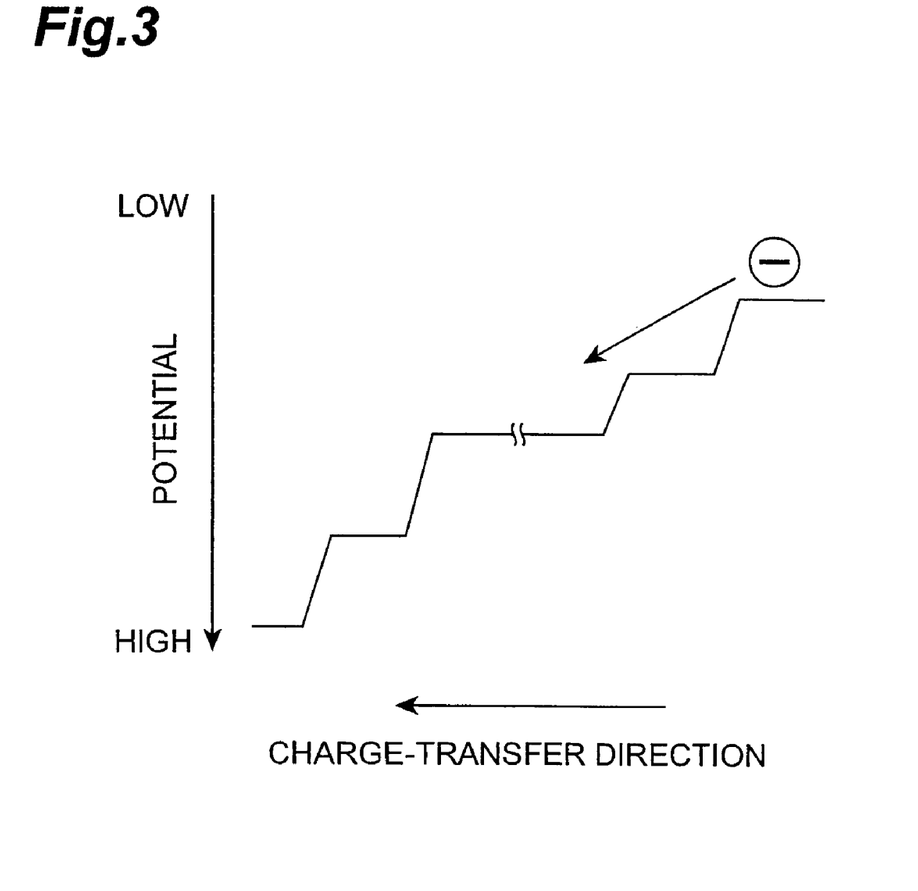
FIG. 3 is a diagram for describing a potential gradient that is formed in an energy ray sensitive region.

The resistor set constituted by the plurality of the voltage dividing resistors 17 are connected in series to the DC power supply 19, with one end 17a of the resistor set being constantly maintained at a fixed positive potential and another end 17b being constantly maintained at a fixed negative potential. Since a DC output potential generated by the corresponding voltage dividing resistor 17 is thereby provided to each of the plurality of the electrodes 15, potential wells, which are formed in the n-type semiconductor layer 55 below the plurality of the electrodes 15, deepen gradually in a direction in which the charges are sent, that is, towards the position of connection with the output section 21 with adjacent potential wells contacting each other as shown in FIG. 3, and a single potential gradient (step-like gradient) is thus formed for the energy ray sensitive region 11. The charges generated in the n-type semiconductor layer 55 below each electrode 15 are thus transferred towards the output section 21 along the potential gradient. It is not necessary to maintain one end 17a of the resistor set at a positive potential and other end 17b at a negative potential, and it is sufficient that other end 17b is maintained at a lower potential than one end 17a of the resistor set, for example, by maintaining one end 17a of the resistor set at +8V and other end 17b at +2V.

The output section 21 is a floating diffusion amp (FDA), and it accumulates charges generated in the energy ray sensitive region 11 and outputs a voltage signal corresponding to the accumulated charge amount. As shown in FIG. 2, the output section 21 includes a summing gate 23, an output gate 25, a floating diffusion 27, a charge resetting MOSFET 29, and a charge-to-voltage converting MOSFET 31.

The summing gate 23 is connected to the energy ray sensitive region 11 and accumulates the charges outputted from the energy ray sensitive region 11. The summing gate 23 has a pair of electrodes 33, low-concentration n-type semiconductor regions 34a, which are respectively formed below and in correspondence to the electrodes 33, and an n-type semiconductor 34b. The electrodes 33 of the summing gate 23 are connected to a terminal SG. The terminal SG is connected to a signal output section that outputs a clock signal.

By switching the logic level of the clock signal inputted into the terminal SG from an H level to an L level, the charges accumulated in the summing gate 23 are outputted from the summing gate 23 to the output gate 25.

The output gate 25 is connected to the summing gate 23, and it inputs the charges outputted from the summing gate 23. The output gate 25 has an electrode 35 and a low-concentration n-type semiconductor region 36 formed below the electrode 35. The electrode 35 of the output gate 25 is connected to a terminal OG, and a fixed voltage is inputted from the terminal OG By inputting the fixed voltage, the output gate 25 fixes the depth of the potential and thereby forms a potential barrier between the summing gate 23 and floating diffusion 27 that prevents the reverse flow of charges.

The charges outputted from the summing gate 23 pass through the output gate 25 and reach the floating diffusion 27. As described above, the summing gate 23 and the output gate 25 can inhibit or allow the movement of charges from the energy ray sensitive region 11 to the floating diffusion 27. When the logic level of the clock signal inputted into the terminal SG becomes the L level, the potential formed below the electrode 33 of the summing gate 23 becomes lower than the potential formed below the electrode 35 of the output gate 25, and the charges accumulated in the summing gate 23 are thereby allowed to move to the output gate 25. On the other hand, when the logic level of the clock signal inputted into the terminal SG becomes the H level, the potential well formed below the electrode 33 of the summing gate 23 becomes deeper than the potential well formed below the electrode 35 of the output gate 25, and the charges accumulated in the summing gate 23 are inhibited from moving to the output gate 25. The energy ray sensitive region 11 and the floating diffusion 27 are capacitively decoupled in this state.

The floating diffusion 27 is a high-concentration n-type semiconductor region. The floating diffusion 27 has a fixed potential when charges are not flowing in and is changed in potential by the flowing in of charges. Also, the floating diffusion 27 is connected through an electrode to a connection point A. This connection point A is connected to a source terminal of the charge resetting MOSFET 29.

A gate terminal of the charge resetting MOSFET 29 is connected to a terminal RG. A reset signal is inputted into the terminal RG The reset signal is outputted to the terminal RG by a signal output section that outputs the reset signal and is inputted into the gate terminal of the charge resetting MOSFET 29 via the terminal RG.

When a reset signal, the logic level of which is the L level, is inputted into the gate terminal of the charge resetting MOSFET 29, the charge resetting MOSFET 29 is put in a non-conducting state. On the other hand, when a reset signal, the logic level of which is the H level, is inputted into the gate terminal of the charge resetting MOSFET 29, the charge resetting MOSFET 29 is put in a conducting state.

A terminal RD is connected to a drain terminal of the charge resetting MOSFET 29 and a fixed positive voltage is applied thereto. When the charge resetting MOSFET 29 is in the conducting state, the charges that have flowed into the floating diffusion 27 can be swept out and the floating diffusion 27 can be returned to its original fixed potential.

The connection point A is connected to a gate terminal of the charge-to-voltage converting MOSFET 31. When the floating diffusion 27 is at the fixed potential, a voltage (VCC) is applied to the gate terminal of the charge-to-voltage converting MOSFET 31, and when charges flow into the floating diffusion 27, a voltage (Ve) corresponding to the amount of charges that have flowed in is subtracted from the voltage (VCC) and the resulting voltage (VCC-Ve) is applied to the gate terminal of the charge-to-voltage converting MOSFET 31.

A drain terminal of charge-to-voltage MOSFET 31 is connected to a terminal OD, and a fixed positive voltage is applied to the terminal OD. The drain terminal of the charge-to-voltage MOSFET 31 is connected to a connection point B, and the connection point B is connected to one end of a resistor 39. The other end of the resistor 39 is grounded. The connection point B is also connected to a terminal OS. The amount of the charges that have been generated in the energy ray sensitive region 11 and have flowed into the floating diffusion is thereby converted to the potential at the terminal OS and outputted from the terminal OS.

Thus, in the energy ray detecting element of the first embodiment, since a corresponding DC output potential is provided to each electrode 15, the potential wells that is formed below the respective electrodes 15 deepen gradually in the direction of transferring the charges, and whereby a single potential gradient is formed for the energy ray sensitive region 11. The charges generated in the energy ray sensitive region 11 (n-type semiconductor layer 55) thereby move rapidly along the potential gradient to the output section 21, and the leaving of unread charges is unlikely to occur. Consequently, the amount of charges read does not decrease and noise is prevented from becoming large in a relative manner.

In the first embodiment, the output section 21 includes the floating diffusion 27, the summing gate 23, and the output gate 25. In this case, when the movement of charges into the floating diffusion 27 is allowed by the summing gate 23 and the output gate 25, the charges, generated in the energy ray sensitive region 11 and accumulated at the summing gate 23, are accumulated in floating diffusion 27. On the other hand, when the movement of charges into the floating diffusion 27 is inhibited by the summing gate 23 and the output gate 25, the energy ray sensitive region 11 and the floating diffusion 27 are capacitively decoupled while the charges generated in the energy ray sensitive region 11 do not flow into the floating diffusion 27. Since the energy ray sensitive region 11 and the floating diffusion 27 are capacitively decoupled, the capacitance of the energy ray sensitive region 11 will not be affected when the amount of charges accumulated in the floating diffusion 27 is converted into a voltage signal. Though the capacitance of the floating diffusion 27 will be affected when the amount of charges accumulated in the floating diffusion 27 is converted into a voltage signal, the floating diffusion 27 can normally be formed to be smaller in area in comparison to the energy ray sensitive region 11 and thus made small in capacitance. Since the energy ray sensitive region 11 and the floating diffusion 27 can thus be capacitively decoupled, the noise that arises when the amount of the accumulated charges is converted to a current signal or a voltage signal can be made small.

Also, in the first embodiment, the voltage dividing resistors 17 divide the DC output voltage from the DC power supply 19. The above-described potential gradient can thus be formed in a stable manner.

The present invention is not restricted to the above-described embodiment. For example, though the output section 21 accumulates the charges generated in the energy ray sensitive region 11 and outputs a voltage signal corresponding to the accumulated charge amount, it may instead be arranged to output a current signal corresponding to the accumulated charge amount. Also, the charge resetting MOSFET 29, charge-to-voltage converting MOSFET 31, resistor 39, etc., do not necessarily have to be formed on the semiconductor substrate 51.

Figure 4:
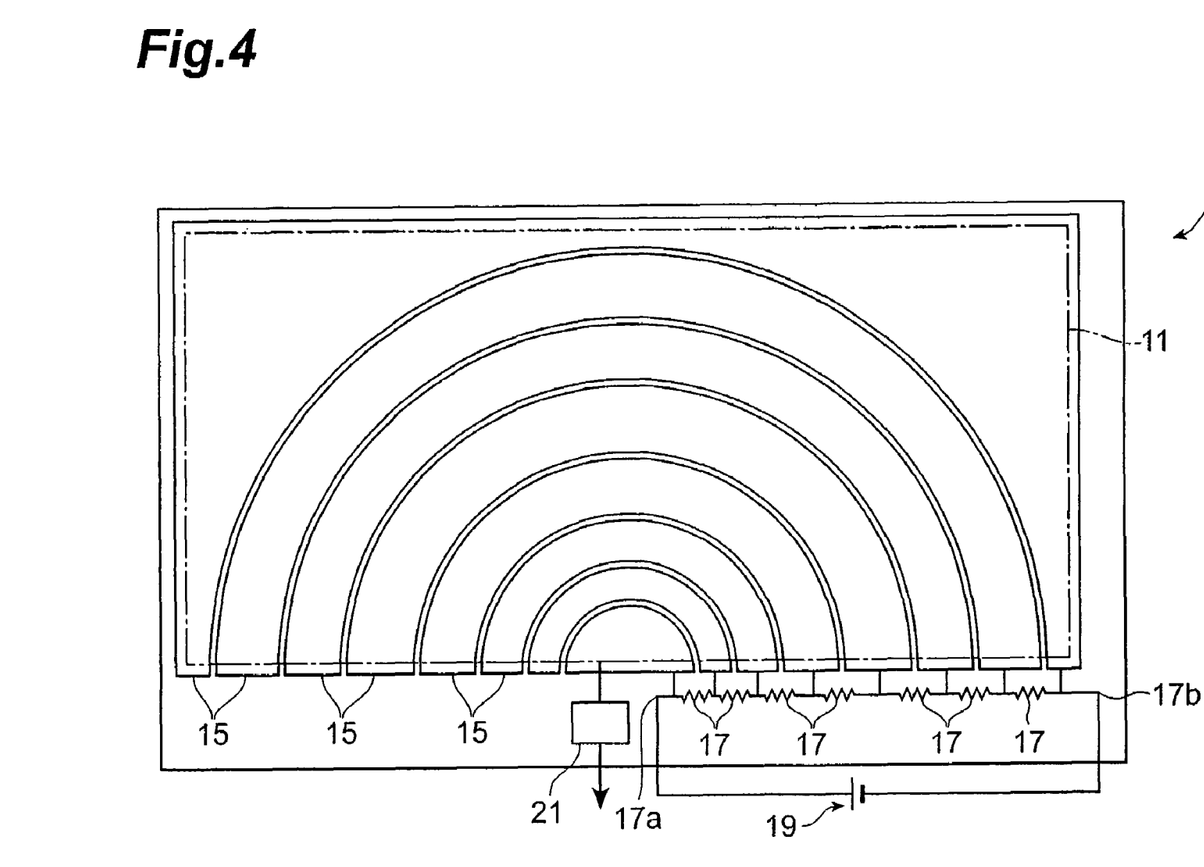
FIG. 4 is a plan view of an arrangement of a second embodiment of an energy ray detecting element according to the present invention.
Figure 5:
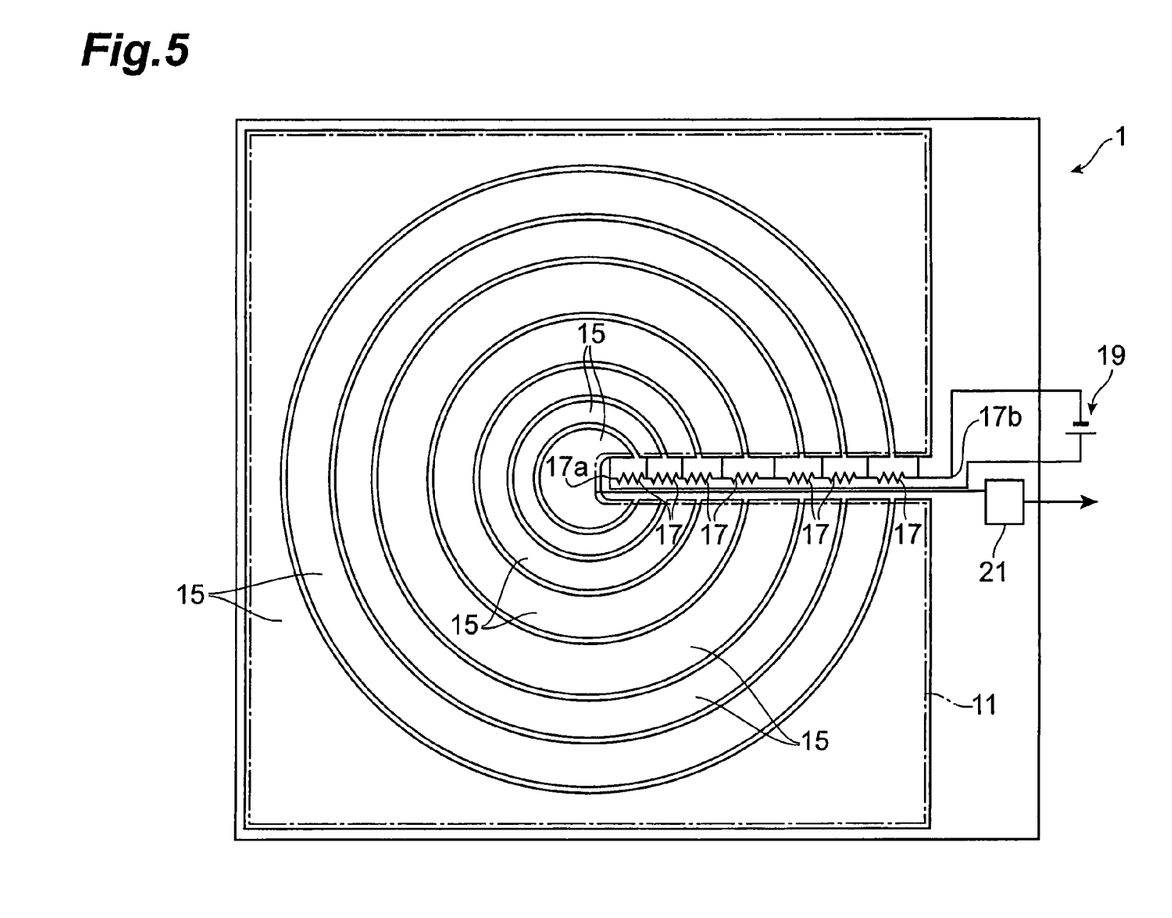
FIG. 5 is a plan view of an arrangement of a third embodiment of an energy ray detecting element according to the present invention.

Furthermore, the number and shape of the electrodes 15 are not restricted to those of the above-described embodiment. For example, FIG. 4 is a plan view of an arrangement of a second embodiment of an energy ray detecting element according to the present invention, and each of the electrodes 15 of the second embodiment has substantially semicircular edges. FIG. 5 is a plan view of an arrangement of a third embodiment of an energy ray detecting element according to the present invention, and each of the electrodes 15 of the third embodiment has substantially circular edges.

The invention claimed is:
1. An energy ray detecting element, comprising:
a semiconductor substrate having an energy ray sensitive region that generates charges in response to the incidence of energy rays;
an output section accumulating the charges generated in said energy ray sensitive region, and outputting a current signal or a voltage signal corresponding to the accumulated charge amount;

a plurality of electrodes, each positioned so as to cover a part of said energy ray sensitive region and transferring the charges generated in said energy ray sensitive region to said output section; and a voltage dividing circuit having terminals directly and electrically connected to said electrodes and coincidentally providing predetermined potentials to said electrodes through said terminals so as to form a single potential well with respect to said energy ray region, said voltage dividing circuit including a plurality of voltage dividing resistors serially connected to each other, each of said voltage dividing resistors providing a corresponding DC output potential to the associated one of said electrodes by dividing a DC output voltage from a DC power supply.

2. An energy ray detecting element according to claim 1, wherein said output section includes:

an impurity region accumulating the charges generated in said energy ray sensitive region; and a gate inhibiting or allowing the movement of charges into said impurity region in accordance with a signal input.

3. An energy ray detecting element, comprising:

a semiconductor substrate having an energy ray sensitive region that generates charges in response to the incidence of energy rays;

an output section accumulating the charges generated in said energy ray sensitive region, and outputting a current signal or a voltage signal corresponding to the accumulated charge amount;

a plurality of electrodes, each positioned so as to cover a part of said energy ray sensitive region and transferring the charges generated in said energy ray sensitive region to said output section; and a voltage dividing circuit including a plurality of voltage dividing resistors that are electrically connected to said electrodes respectively and are serially connected to each other, and terminals directly and electrically connected to said electrodes, said voltage dividing circuit coincidentally providing predetermined potentials to said electrodes through said terminals so as to form a single potential well with respect to said energy ray region, bottom parts of said single potential well formed, which are positioned below said electrodes, becoming gradually deeper in a charge transferring direction.

4. An energy ray detecting element according to claim 3, wherein said output section includes:

an impurity region accumulating the charges generate in said energy ray sensitive region; and a gate inhibiting or allowing the movement of charges into said impurity region in accordance with a signal input.

* * * * *